United States Patent [19]
Chonan

[11] Patent Number: 5,777,932
[45] Date of Patent: Jul. 7, 1998

[54] SEMICONDUCTOR MEMORY DEVICE TEST CIRCUIT HAVING AN IMPROVED COMPARE SIGNAL GENERATOR CIRCUIT

[75] Inventor: Toru Chonan, Tokyo, Japan

[73] Assignee: NEC Corporation, Tokyo, Japan

[21] Appl. No.: 736,402

[22] Filed: Oct. 24, 1996

[30] Foreign Application Priority Data

Oct. 31, 1995 [JP] Japan .................................. 7-282954

[51] Int. Cl.⁶ .................................................. G11C 7/00
[52] U.S. Cl. ............... 365/201; 365/189.01; 365/189.07; 365/189.08
[58] Field of Search ............... 365/201, 189.01, 365/189.07, 189.08

[56] References Cited

U.S. PATENT DOCUMENTS

| | | | |
|---|---|---|---|
| 5,436,911 | 7/1995 | Mori | 371/21.1 |
| 5,557,574 | 9/1996 | Senoo et al. | 365/201 |
| 5,559,744 | 9/1996 | Kuriyama et al. | 365/201 |

*Primary Examiner*—David C. Nelms
*Assistant Examiner*—Hien Nguyen
*Attorney, Agent, or Firm*—Foley & Lardner

[57] ABSTRACT

A test circuit for a DRAM is disclosed to preform a test operation in a page mode. The test circuit includes a compare control block 7A having a compare determination signal generator circuit 71 which generates a compare determination signal Φ1 in response to a change from an active low level to an inactive high level of column address strobe or CAS signal during an active low level of a row address strobe or RAS signal.

3 Claims, 9 Drawing Sheets

SEMICONDUCTOR MEMORY DEVICE TEST CIRCUIT HAVING AN IMPROVED COMPARE SIGNAL GENERATOR CIRCUIT

BACKGROUND OF THE INVENTION

1. Field of the Invention

The present invention relates to a semiconductor memory device and, more particularly, to a dynamic random access memory device (DRAM) equipped with a test circuit.

2. Description of the Prior Art

As the capacity of memory increases more and more the required time for testing it also significantly increases, and imposes a serious problem on 16M DRAM and larger devices. As a countermeasure there is a method in which a test circuit is mounted in a chip and testing is performed by changing over the operation of the chip to a test mode which differs from normal operation (hereinafter called "entry").

Test modes for shortening the test time include one using a data comparison method in which addresses are first compacted, data are simultaneously written in or read from a plurality of memory cells, matching of the data is determined, and "H" is output if matched, or "L" is output if unmatched. However, when a conventional multifunction tester is used, the number of devices which can be tested by one tester may be as much as 16 DUT (Device Under Test), so that the test time is not sufficiently shortened even by this method. In view of this, the test method is being shifted for DRAMs with large capacity developed after 16M DRAMs to a method mainly utilizing a monitor BT device in which a number of DUT, for example, 200–300 DUT can be mounted on one test board. However, in practice, the efficiency of the test is not so remarkably improved even if such a monitor BT device is used.

Figure 6:
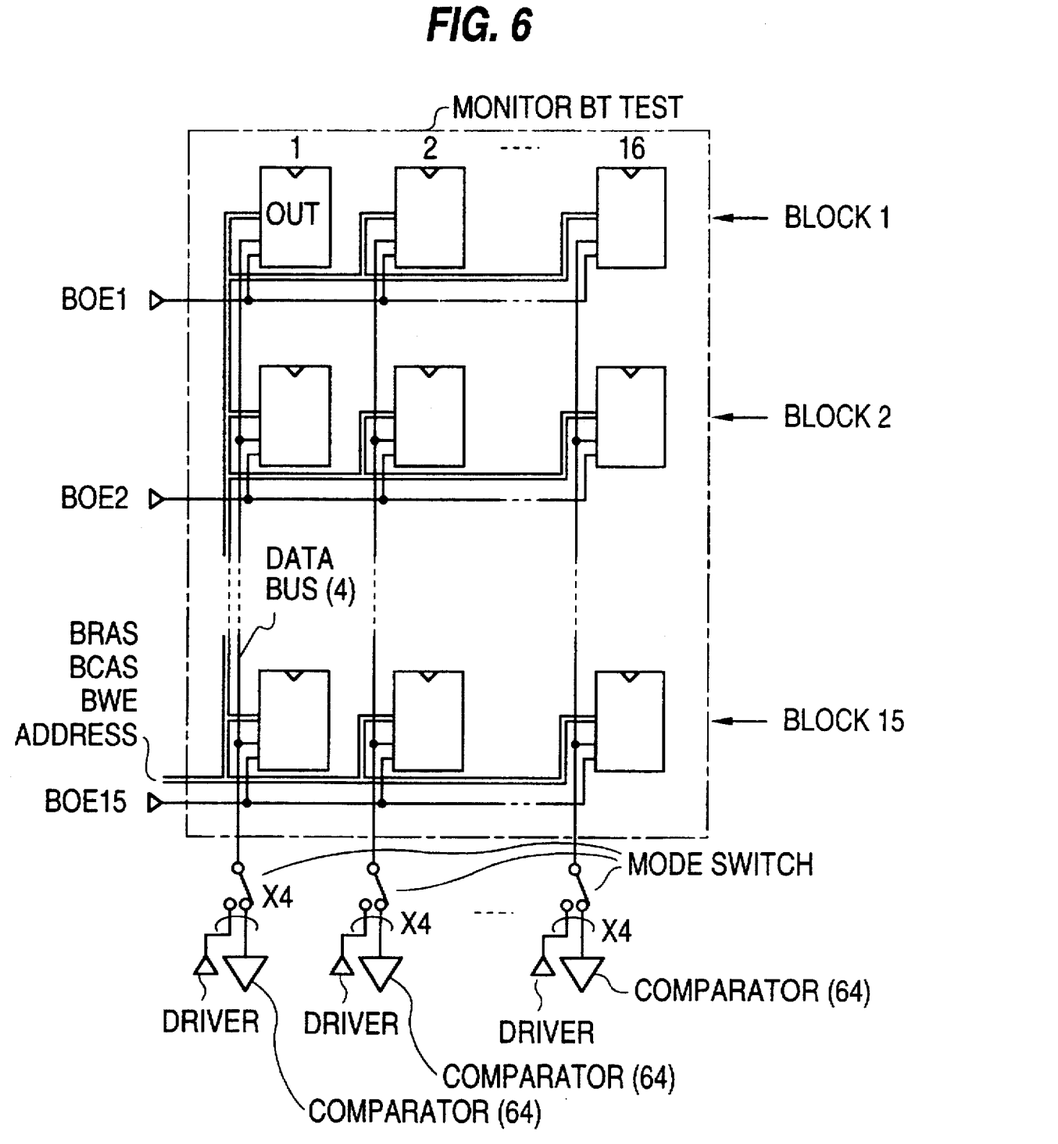
FIG. 6 is a block diagram showing an example of monitor BT test board.

The reason of the above is described here by referring to FIG. 6 showing one example of a test board for the monitor BT device. The monitor BT test board can be mounted with 16 columns×15 rows=240 DUT of four-bit (×4) DUT. The monitor BT device provides 64 drivers/comparators per test board.

Therefore, one data bus connects to I/Os for 15 DUT. All clock and address signals such as a backward row address strobe signal (BRAS), a backward column address strobe signal (BCAS), and a backward write enable signal (BWE) (e.g., $\overline{RAS}$, $\overline{CAS}$, and $\overline{WE}$ respectively) are connected to all DUTS. A backward operation enable signal (BOE) (e.g., $\overline{OE}$) for controlling the test operation is independently distributed to blocks 1–15 as BOE 1–BOE 15. Each of BOE 1–BOE 15 can supply a different clock for separate operation. With this test board, when it is intended to test all DUT at once, 15 DUT connected to one data bus simultaneously attempt to output data, causing collision between data from each DUT so that each DUT cannot be determined for acceptance. Therefore, for example, when 16 DUT in the block 1 are tested, only block 1 can be tested by clocking only BOE 1 corresponding to the block 1, while holding BOE 2–BOE 15 for other blocks at "H." Eventually, the blocks 1–15 are tested in 15 separate tests. Thus, the test time necessary to test 240 DUT is (case where all DUT can be tested at once)×15. For a type with a higher bit number, the test must be carried out by multiplying the division number for a block (15 for ×4) by (number of I/O)/4, so that the test efficiency is lowered further. In addition, since the monitor BT device is limited by the number of comparators, conventionally, it is unavailable because the efficiency reaches its upper limit when the monitor BT device is used.

As countermeasures for the above problems, there is an on-chip compare test mode which enables the monitor BT

2 device to test all chips at once. The cause of the above-mentioned problem lies in that, when the data output cycle is simultaneously instructed for all chips, output data from a plurality of DUT collide on the data bus. Therefore, this problem can be avoided if the data read from a memory cell is not output outside the plurality of DUT, but acceptance is determined within a chip. Then, it would be sufficient to latch the acceptance determination result within the chip, and, after all memory cells are tested, to output the acceptance determination results to the data bus of the monitor BT test board by block for comparison. Since the output of acceptance determination result can be completed in one cycle, and is much shorter than the test time for a chip, there arises no problem even if the test is performed for 15 separate blocks. For example, only 15 μs is required even if the output cycle of acceptance determination result is performed in 1 μs. The total test time in such a case is (test time for a chip+15 μs), which is substantially equal to a case where all chips can be tested at once. This is the concept of the on-chip compare test mode.

Figure 7:
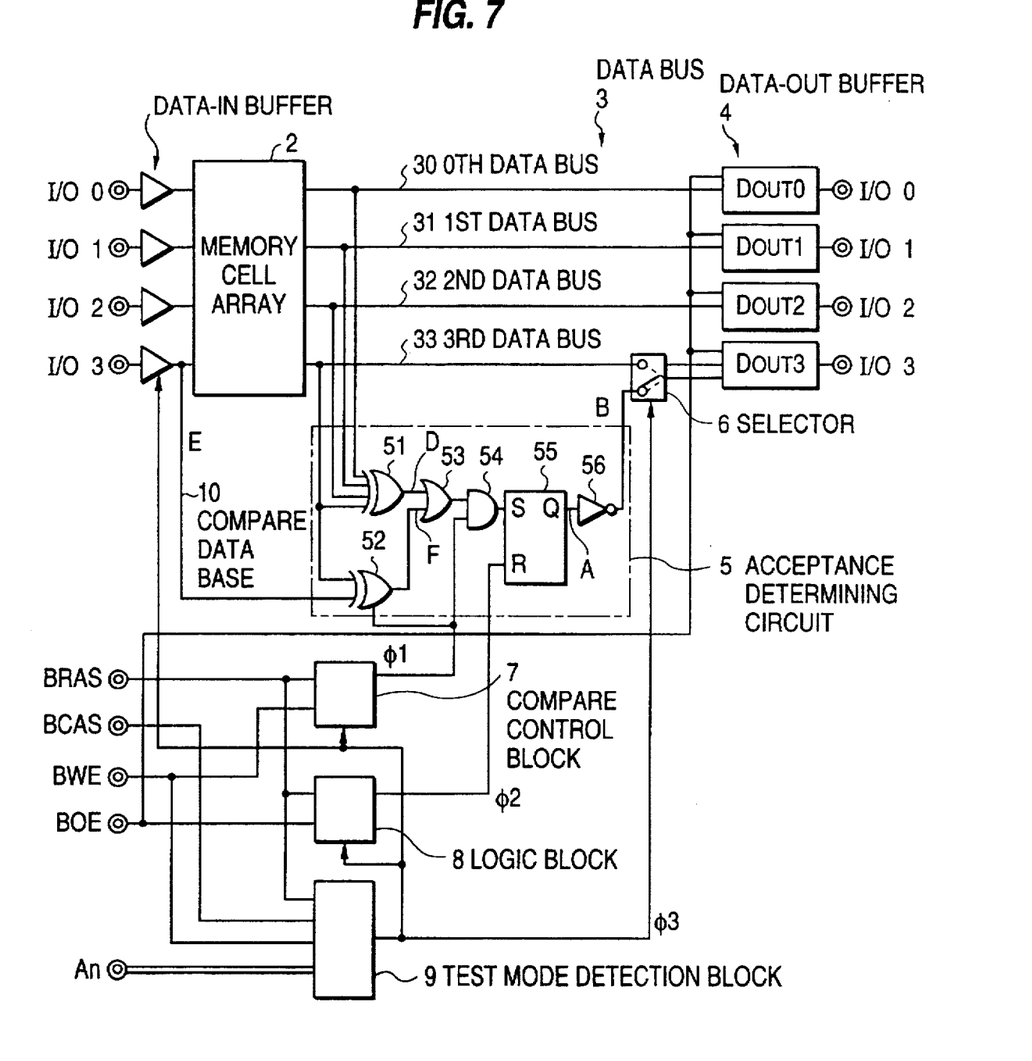
FIG. 7 is a block diagram showing an example of a conventional test circuit.

Referring to FIG. 7, there is shown a block diagram of a conventional test circuit having the on-chip compare test mode function. The conventional test circuit comprises a data-in buffer 1 constituting an ordinary dynamic memory circuit, a memory cell array 2, data buses 3 consisting of 0-th to 3-rd data buses 30–33, and a data-out buffer 4, and further comprises an acceptance determination circuit 5 detecting matching between each data from the data buses 3, determining acceptance and outputting an acceptance determination signal B, a selector 6 selecting and outputting either one of the acceptance determination signal B and data from the 3-rd data bus 33, a compare control block 7, a logic block 8 for signals BRAS and BOE, a test mode determination block 9, and a compare data bus 10.

The acceptance determining circuit 5 comprises an XOR gate 51 for detecting matching of data from the 0-th to 3-rd data buses 30–33, an XOR gate 52 for detecting matching or mismatching between data on the compare data bus 10 and the 3-rd data bus 33, an OR gate 53 for ORing each output from the XOR gates 51 and 52, an AND gate 54 for activating the output of the OR gate 53 with an on-chip compare enable signal Φ1, an RS type flip-flop (FF) 55 for latching the output of the AND gate 54 and outputting a determination signal A, and an invertor 56 for inverting the determination signal A and outputting the acceptance determination signal B.

Figure 8A:
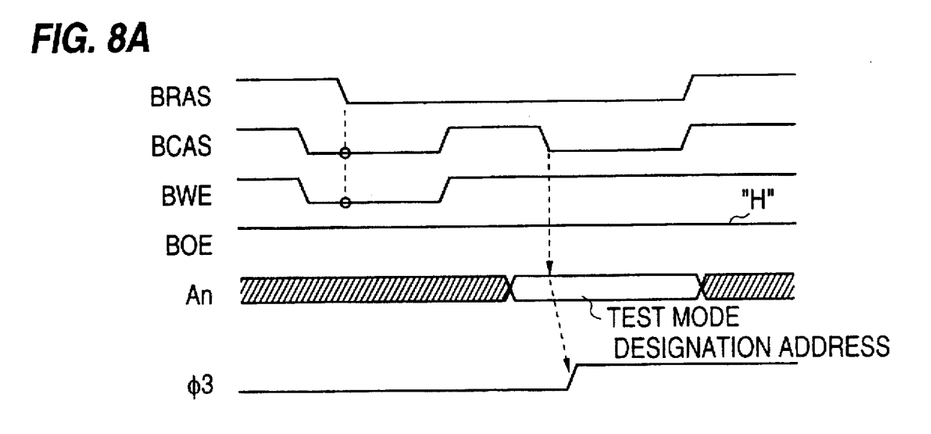
FIGS. 8A to 8C are time charts showing a part of the operation of the conventional test circuit.
Figure 8B:
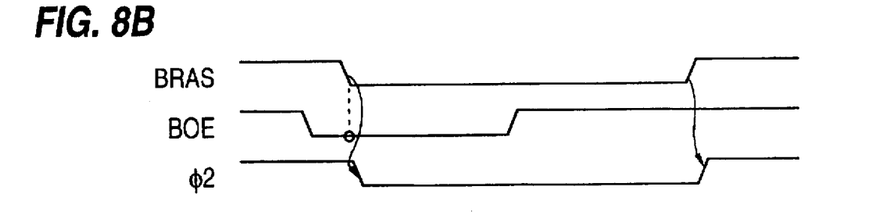
Figure 8C:
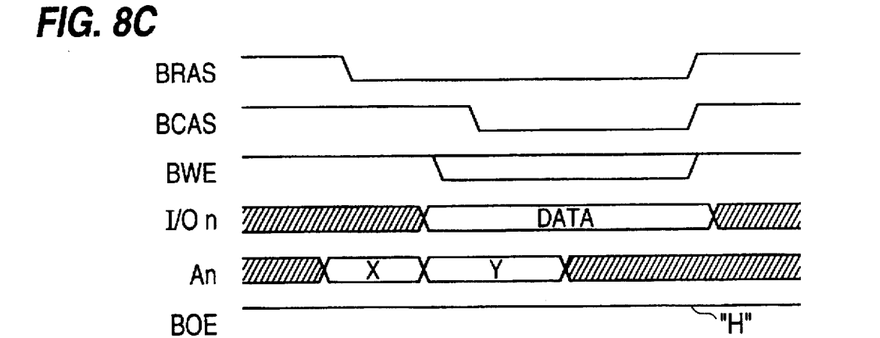
Figure 9A:
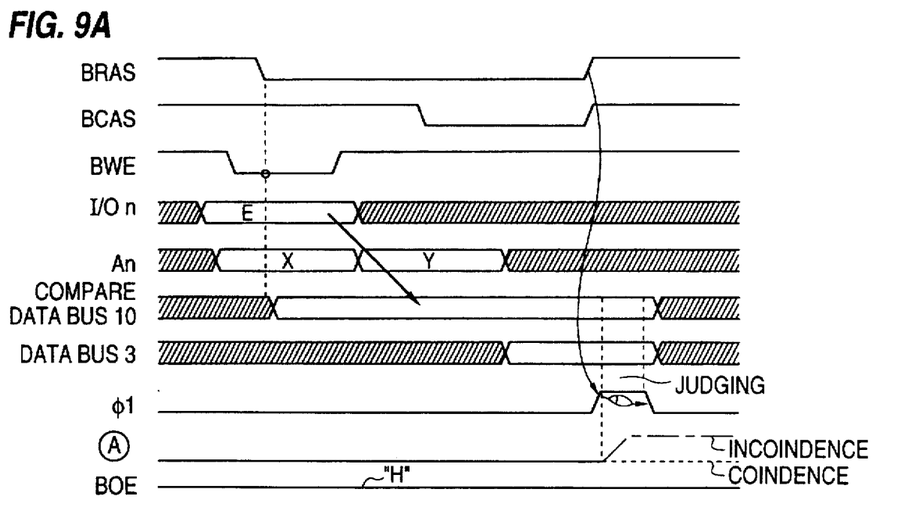
FIGS. 9A to 9C are time charts showing another part of the operation of the conventional test circuit.
Figure 9B:
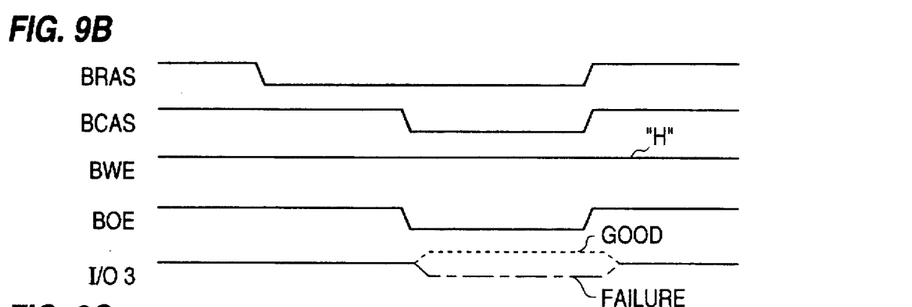
Figure 9C:
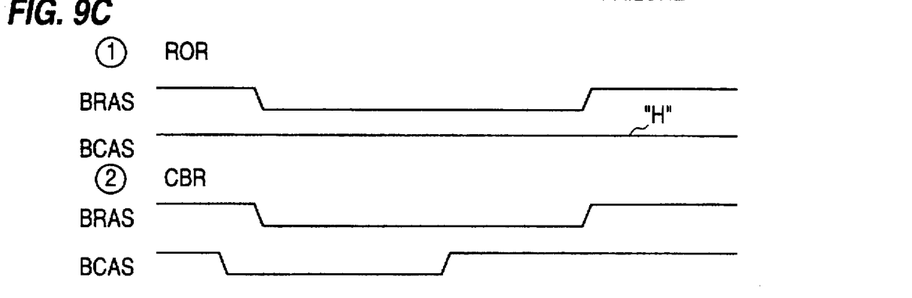

The operation of the conventional test circuit is described by referring to FIG. 7, and FIGS. 8 and 9 which are time charts showing waveforms at the sections of the test circuit. FIG. 8A shows an on-chip compare test mode entry cycle which detects a test mode to be entered from the fact that both signals BCAS and BWE are "L" when the signal BRAS is activated and turned to "L." Then, it is detected that the on-chip compare test mode is entered from Y address when the signal BCAS is once deactivated to "H" and turned to "L" again, and turns an on-chip compare test mode determination signal Φ3 to "H."

Then, it proceeds to a reset cycle of FF 55 shown in FIG. 8B. As described above, FF 55 stores the acceptance determination result within the chip, and stores a fail flag indicating rejection when even one bit of the memory cell in the memory cell array 2 is defective (fail). Therefore, it is first necessary, prior to starting the test to reset FF 55 so that it outputs "acceptance." Here, resetting of FF 55 is started by detecting that the signal BOE is "L" immediately after the signal BRAS is shifted to "L" and by turning FF reset signal Φ2 to "L," and is completed when the signal BRAS is deactivated again, that is, shifted to "H."

Then, the circuit proceeds to a disturb cycle for writing or written cell data shown in FIG. 8C. This corresponds to a routine before data reading in an ordinary test, and is a main routine of the test.

FIG. 9A is an on-chip compare cycle, and corresponds to data reading in the ordinary test. It detects the on-chip compare cycle from "L" state of the signal BWE when the signal BRAS is shifted to "L," and, at the same time, supplies and latches an expected value E for cell data on the compare data bus 10. At the same time, X address is taken in as in the ordinary operation. Then, Y address is taken in and latched by turning the signal BCAS to "L," and the memory cell data for (X, Y) is read to the data buses. When the memory cell data is read, matching or mismatching between data on the 0-th to 3-rd data buses 30–33 are detected by the XOR gate 51, and a matching signal D is output. On the other hand, the XOR gate 52 detects matching of the expected value E on the 3-rd data bus 33 and the compare data bus 10, and outputs a matching signal F, while the OR gate 53 ORs the signal F, the detection result on data matching from the XOR gate 51, and the matching signal D, and supplies the result to one input terminal of the AND gate 54. The compare control block 7 shifts the signal Φ1 to "H" in one shot in response to the detection of the on-chip compare cycle state when the signal BRAS shifts to "H," and supplies it to another input terminal of the AND gate 54. The AND gate 54 ANDS these signals, and stores the result in FF 55. If all matching signals D and F indicate the matched state, the determination signal A remains "L" (Coincidence). However, if there is any unmatched state, the signal A turns to "H"(Incoincidence). If any one bit of the memory cell fails when the cycle is performed for all addresses, the signal A turns to "H." In this case, the signal BOE is maintained at the deactivated state, or "H" so that there is no output outside the chip, or to the data bus of the monitor BT test board.

FIG. 9B is a determination result output cycle which outputs the acceptance determination signal B to the data bus of the monitor BT test board when the signals BCAS and BOE are shifted to "L" after the signal BRAS is shifted to "L." The determination result output cycle is sequentially performed for blocks 1–15 of the monitor BT test board, and the monitor BT device determines with the expected value of "H" to be acceptable when I/O 3 is "H," and to be rejectable for "L." Thus, the test is completed.

FIG. 9C is a test mode reset cycle in which the test mode determination block 9 resets the test mode with ROR (RAS only refresh) or CBR (CAS before RAS refresh), and sets the signal Φ3 to "L." The selector 6 selects the data bus 33 in response to "L" of the signal Φ3.

This conventional test circuit significantly reduces the test time by the monitor BT device, and takes about 1/15 the time for the above test board. However, since the conventional test circuit determines acceptance in response to the activation of the on-chip compare test mode determination signal Φ3 only at one shot when the signal BRAS is deactivated, that is, when it shifts to "H," it can test only the RAS/CAS cycle, and cannot perform the test in a fast page mode. On the other hand, since the test items include many tests in the fast page mode operation, the effect obtained by the reduction of test time is not remarkable unless these tests can be performed in the on-chip compare test mode.

For example, in testing a 64M DRAM, there are function tests in the fast page mode of about 1 minute 30 seconds in total. If the on-chip compare test mode is unavailable, the tests take 1 minute 30 seconds×15=22 minutes 30 seconds. While the total test time is about 40 minutes for tests other than those in the fast page mode, there arises a considerable impact on the total time because of the fact that 22 minutes 30 seconds must be added to the total time because the tests in the fast page mode cannot be performed in the compare test mode.

SUMMARY OF THE INVENTION

It is therefore an object of the present invention to provide a semiconductor memory device equipped with an improved test circuit.

It is another object of the present invention is to provide a DRAM which can perform a test operation in a page mode.

A semiconductor memory device according to the present invention comprises a memory cell array in which a plurality of memory cells are arranged in a matrix, and a first data bus and a second data bus which output a first memory data and a second memory data read out from the memory cell array, respectively, the test circuit comprising an expected value data bus for transmitting expected value data, a test control circuit for outputting a test control signal by detecting a predetermined test mode state, and an acceptance determination circuit for detecting matching between the first and second memory data and between the first memory data and the expected value data in response to supply of the test control signal, and for outputting an acceptance determination signal corresponding to acceptance or rejection of the memory cell array, and is characterized in that the test control circuit comprises a test control signal generator circuit for generating the test control signal in response to shifting of a column address strobe signal to a deactivated state when a row address strobe signal is activated.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
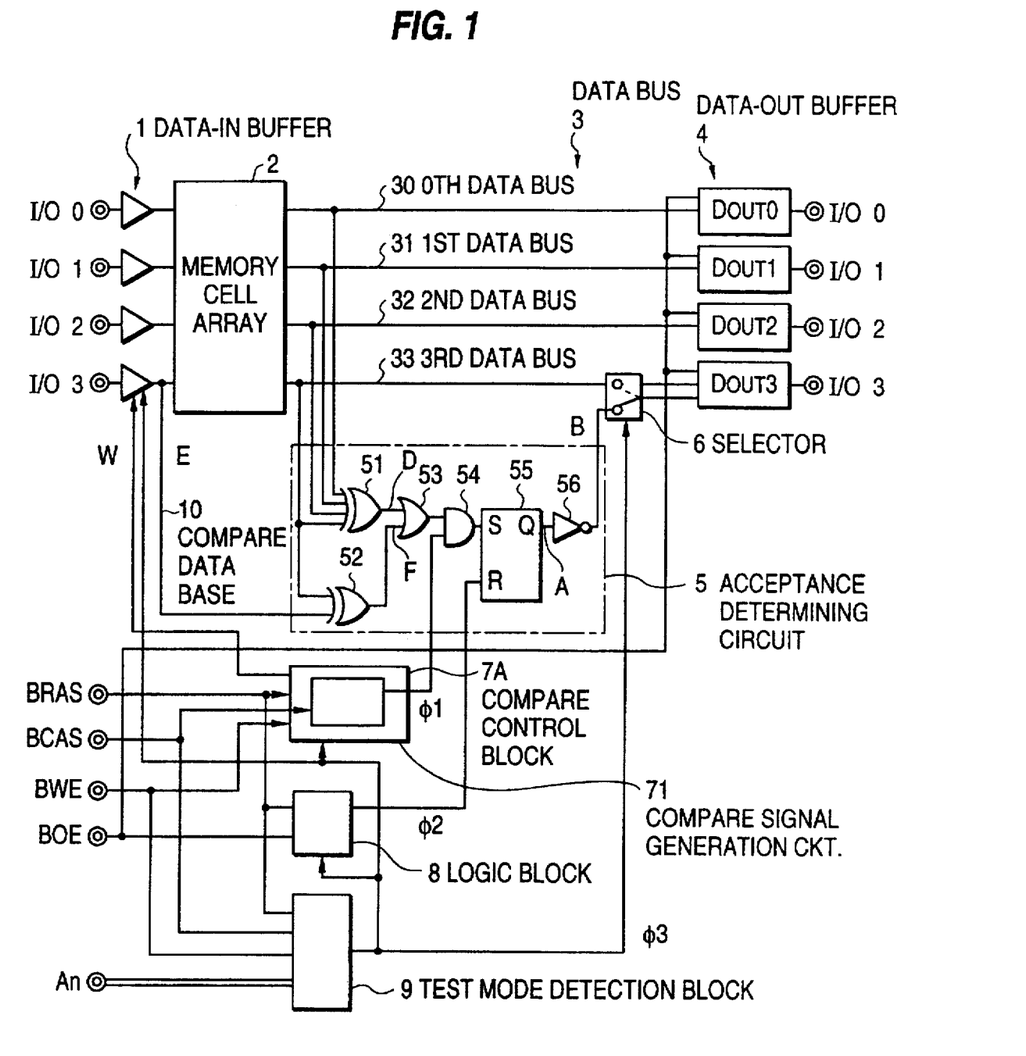
FIG. 1 is a block diagram showing a first embodiment of the test circuit according to the present invention.

Now, referring to FIG. 1 showing an embodiment of the present invention in a block diagram in which similar components to those in FIG. 7 are identified by like references, the test circuit of the embodiment shown in the figure comprises a data-in buffer 1 similar to the prior art, a memory cell array 2, data buses 3 consisting of the 0-th to 3-rd data buses 30–33, a data-out buffer 4, an acceptance determining circuit 5, a selector 6, a logic block 8, a test mode detection block 9, and a compare data bus 10, as well as a compare control block 7A (in place of the compare control block 7), the compare control block 7A comprising a compare signal generation circuit 71 for outputting a compare determination signal Φ1 in response to deactivation of a signal BCAS.

Now, the operation of the embodiment is described by referring to FIG. 1, and FIGS. 2–4 showing operation time charts at each section. FIG. 2A is an on-chip compare test mode entry cycle for detecting, as in the prior art, that a test mode has been entered from the fact that both signals BCAS and BWE are "L" when the signal BRAS is activated and turned to "L." It detects that the on-chip compare test mode is entered from the Y address when the signal BCAS is once deactivated to "H" and turned to "L" again, and turns the on-chip compare test mode determination signal Φ3 to "H." This activates the compare control block 7A, the logic block 8, the compare data bus 10, and FF 55. In addition, the selector 6 selects an acceptance determination signal B.

Figure 2A:
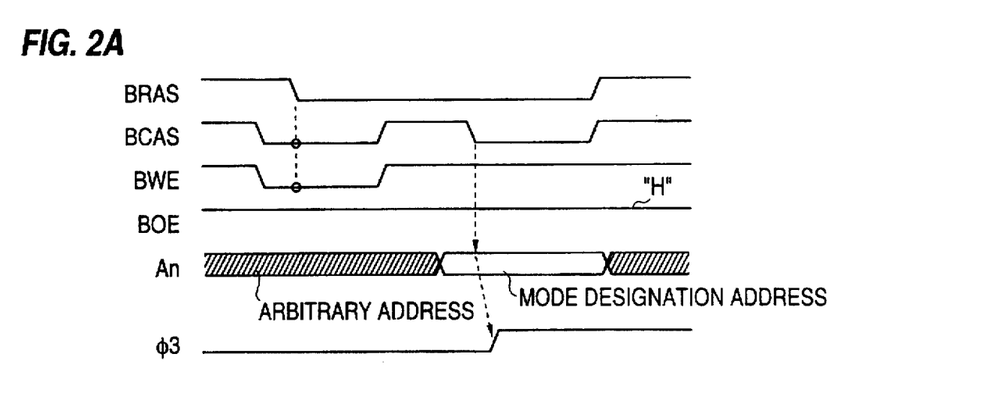
FIGS. 2A to 2C are time charts showing a part of operation of the test circuit of the embodiment.
Figure 2B:
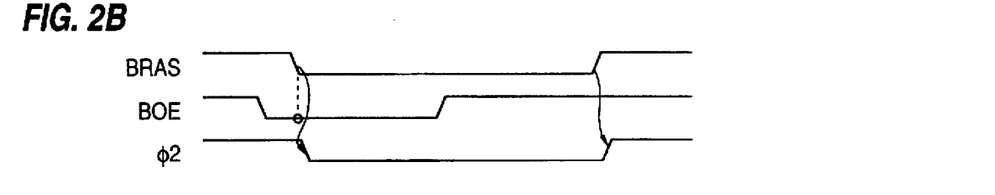

Then, the reset cycle, similar to the prior art, shown in FIG. 2B is performed for FF 55. Resetting of FF 55 is started by detecting that the signal BOE is "L" immediately after the signal BRAS shifts to "L," and turning an FF reset signal Φ2 to "L," and completed when the signal BRAS is shifted to "H" again.

Figure 2C:
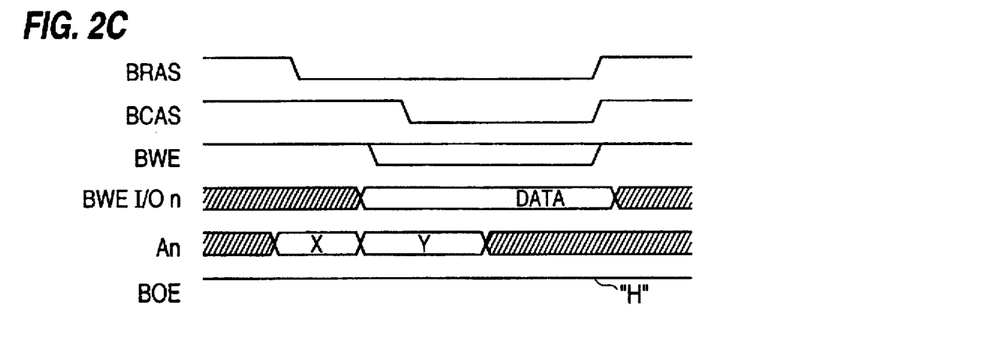

Then, the circuit proceeds to a disturb cycle for writing or written cell data which is a main routine of the test as shown in FIG. 2C.

Figure 3:
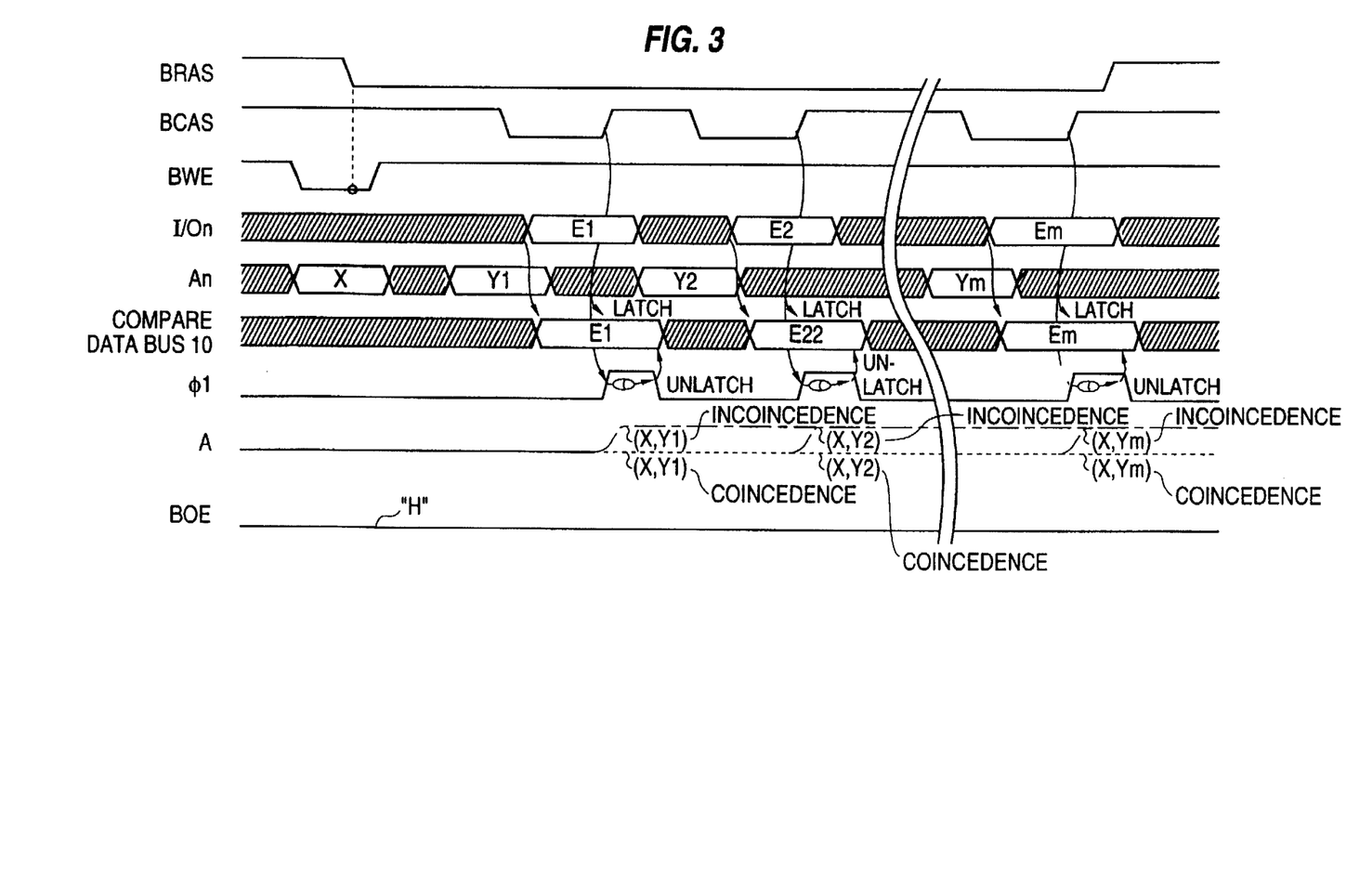
FIG. 3 is time charts showing another part of operation of the test circuit of the embodiment.

The circuit then performs an on-chip compare cycle corresponding to data reading in the ordinary test shown in FIG. 3. The compare control block 7A detects the on-chip compare cycle from the "L" state of signal BWE when the signal BRAS shifts to "L," and the process enters a prepare activation state for an on-chip compare determination signal Φ1 in response to shifting of the signal BCAS to "H." An X address is taken in as in the normal operation when the signal BRAS shifts to "L," and then a Y address is taken in and latched when the signal BCAS shifts to "L." As in the prior art, these (X, Y) memory cell data are read onto the data bus. I/O 3 takes in an expected value E1 of memory cell data prior to shifting of the signal BCAS to "H," and latches the expected value E1 on the compare data bus 10 when the signal BCAS shifts to "H."0 At the same time, the compare control block 7A causes the signal Φ1 to shift to "H" in one shot. The XOR gate 51 of an acceptance determining circuit 5 detects matching between data of the 0-th to the 3-rd data busses 30–33, and outputs data D, while XOR gate 52 detects matching between the expected value E1 on the 3-rd data bus 33 and that on the compare data bus 10, and outputs data F. These data D and F are supplied to the OR gate 53. The OR gate 53 ORs the matching signals D and F, and supplies to one input terminal of the AND gate 54. The AND gate 54 supplies the ORed signal of the matching signals D and F to FF 55 in response to shifting of the signal Φ1 to "H", which is supplied to the other input terminal. FF 55 stores this matching ORed signal. If all matching signals D and F indicate a matched state, the determination signal A remains at "L," while, if there is any unmatched state, the signal A turns to "H."

Then, BCAS is again shifted to "L" by changing Y address, and that Y address is latched to read corresponding memory cell data. Similarly, when the signal BCAS shifts to "H," the expected value E2 of the memory cell data is latched on the compare bus 10. The compare control block 7A shifts the signal Φ1 to "H," determines matching between the read out data and the expected value E2 in the acceptance determination circuit 5, and outputs the determination signal A. Thus, the determination signal A becomes "H" when even one bit in the memory cells at all Y addresses on any X address is determined to have failed, that is, mismatching is detected by sequentially changing the Y address in the fast page mode. By performing this for all X addresses, all memory cells are tested in the fast page mode.

Figure 4A:
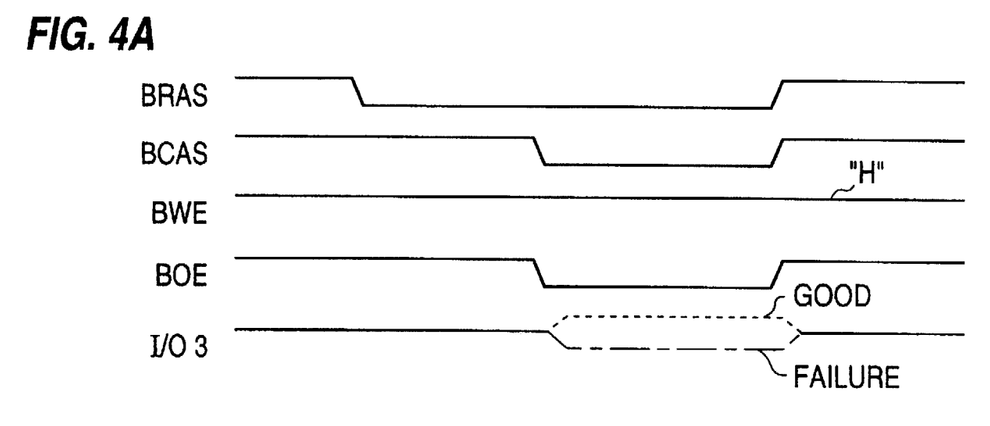
FIGS. 4A and 4B are time charts showing another part of operation of the test circuit of the embodiment.

FIG. 4A is a determination result output cycle in which an acceptance determination signal B is output onto the data bus of the monitor BT test board when the signals BCAS and BOE shift to "L" after the signal BRAS shifts to "L." The determination result output cycle is sequentially performed for the blocks 1–15 of the monitor BT test board. The monitor BT device determines with the expected value of "H", to be acceptable if I/O 3 is "H" and (Good) to be rejectable if it is "L" (Failure). Thus, the test is completed.

Figure 4B:
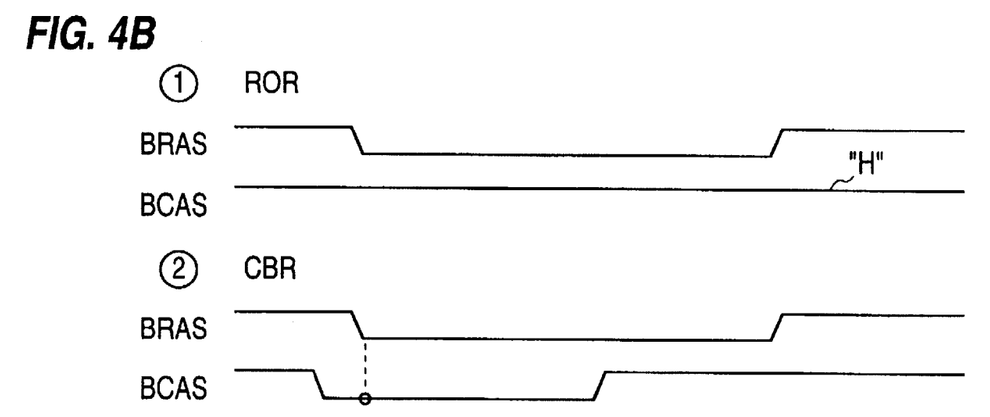

FIG. 4B is a test mode reset cycle in which, as in the prior art, the test mode determination block 9 resets the test mode with ROR (RAS only refresh) or CBR (CAS before RAS refresh), and sets the test mode determination signal Φ3 to "L." In response to "L" of the signal Φ3, the selector 6 selects the 3rd data bus 33.

As described above, while the conventional test circuit determines acceptance or rejection when the row address strobe signal is deactivated, the above described embodiment determines it when the column address is deactivated, whereby the test in the fast page mode can be performed in the on-chip compare test, and the test time when using the monitor BT device can be significantly reduced.

When the same test board as that in the prior art and shown in FIG. 6 is used, the test time can be reduced to about 1/15 the time of a case where the on-chip compare test is not performed. In addition, when the test time is taken as an example for 64M DRAMs as in prior art, it can be reduced in this embodiment to 40 minutes+1 minute 30 seconds=41 minutes 30 seconds under the same conditions, while the conventional test time is 62 minutes 30 seconds. Thus, the effect is remarkable.

Figure 5:
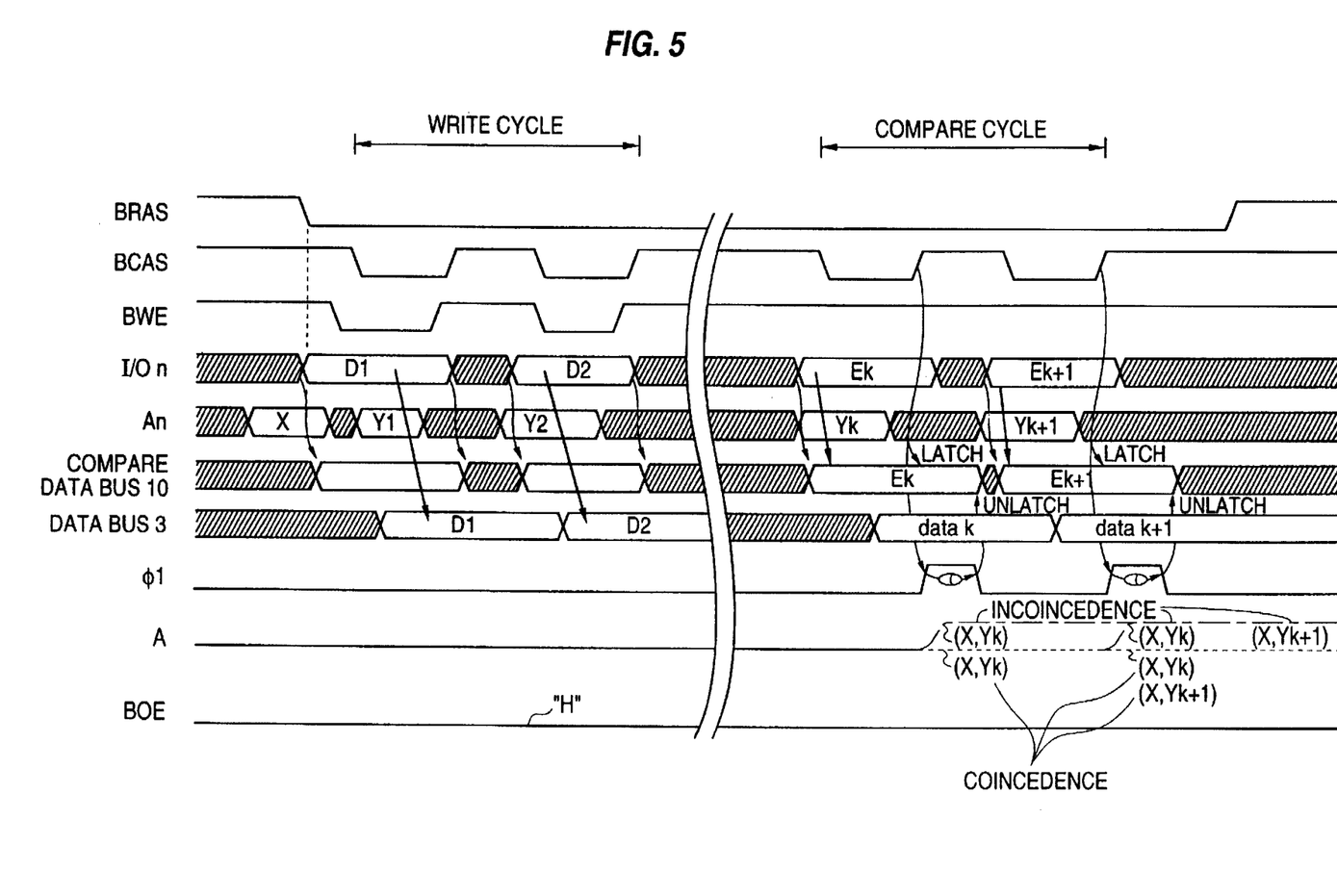
FIG. 5 is a time chart showing a second embodiment of the test circuit according to the present invention.

Now, referring to FIG. 5 showing time charts for a second embodiment of the present invention, the difference from the first embodiment lies in that the second embodiment comprises a compare control block 7B in place of the compare control block 7A. Functions of the compare control block 7B including detecting that the test mode is the on-chip compare cycle in response to activation or "H" of the test mode determination signal Φ3 at the test mode entry, thereby activating the on-chip compare determination signal Φ1 by one shot when the signal BCAS shifts to "H," and determining that the test mode is not the on-chip compare cycle if the signal BWE shifts to "L," thereby turning the test mode to the write cycle without activating the signal Φ1.

Since this embodiment does not require detecting the on-chip compare cycle state by turning the signal BWE to "L" when the signal BRAS shifts to "L" as in the first embodiment, there is no need to create fast page mode timing dedicated to the on-chip compare test, so that a conventional test program can be used as is.

As described above, since the test circuit of the present invention comprises a test control signal generator circuit in which a test control circuit generates a test control signal in response to deactivation of the signal CAS when the signal RAS is activated, it can significantly reduce the test time for a test using the monitor BT device by enabling it to perform the function tests of the fast page mode which determines acceptance or rejection in a chip.

What is claimed is:

1. A semiconductor memory device test circuit comprising:

a memory cell array having a plurality of memory cells;

a test mode detection circuit for setting said semiconductor memory device test circuit to an on-chip compare test mode;

an expected data output circuit for outputting expected value data in said on-chip compare test mode;

an acceptance determining circuit for comparing read out data of said memory cell array with said expected value data whenever a compare signal becomes active, and for determining matching between said read out data and said expected value data in said on-chip compare test mode; and a compare signal generation circuit for generating said compare signal in response to every change from an active level to an inactive level of a column address strobe signal during an active level of a row address strobe signal while in said on-chip compare test mode.

2. The memory device as claimed in claim 1, wherein said acceptance determining circuit comprises:

a first comparing circuit for comparing one bit of said read out data with said expected value data directly and providing a first output;

a second comparing circuit for comparing other bits of said read out data with said one bit of said read out data and providing a second output;

a detecting match circuit for detecting a match between said read out data and said expected data from said outputs of said first comparing circuit and second comparing circuit; and a holding circuit for holding an output of said detecting match circuit.

3. The memory device as claimed in claim 1, wherein said compare signal generation circuit inputs a write enable signal, wherein an active level of said write enable signal inhibits generation of said compare signal.

* * * * *